United States Patent
Yang et al.

(10) Patent No.: US 8,604,945 B2
(45) Date of Patent: Dec. 10, 2013

(54) APPARATUS AND METHOD FOR CHANNEL ENCODING IN A COMMUNICATION/BROADCASTING SYSTEM

(75) Inventors: Hyun-Koo Yang, Seoul (KR); Hong-Sil Jeong, Seoul (KR); Seho Myung, Suwon-si (KR); Jae-Yoel Kim, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 127 days.

(21) Appl. No.: 13/080,032

(22) Filed: Apr. 5, 2011

(65) Prior Publication Data

US 2011/0241911 A1    Oct. 6, 2011

(30) Foreign Application Priority Data

Apr. 5, 2010 (KR) .................. 10-2010-0031147

(51) Int. Cl.
*H03M 7/00* (2006.01)

(52) U.S. Cl.
USPC .................. 341/50; 341/51; 341/52; 341/107

(58) Field of Classification Search
USPC .................. 341/52, 65, 67, 107, 50
See application file for complete search history.

(56) References Cited

U.S. PATENT DOCUMENTS

| | | | | |
|---|---|---|---|---|
| 6,636,641 | B1* | 10/2003 | Kimura et al. | 382/238 |
| 6,677,865 | B1* | 1/2004 | Xu | 341/50 |
| 6,909,383 | B2* | 6/2005 | Shokrollahi et al. | 341/50 |
| 6,943,710 | B2* | 9/2005 | Marpe et al. | 341/106 |
| 7,233,264 | B2* | 6/2007 | Luby | 341/50 |
| 7,293,222 | B2* | 11/2007 | Shokrollahi et al. | 714/777 |
| 7,532,763 | B2* | 5/2009 | Yu et al. | 382/238 |
| 7,644,335 | B2* | 1/2010 | Luby et al. | 714/752 |
| 7,956,772 | B2* | 6/2011 | Shokrollahi et al. | 341/51 |
| 2003/0103573 | A1* | 6/2003 | Woo et al. | 375/245 |
| 2003/0128215 | A1* | 7/2003 | Kim et al. | 345/473 |
| 2009/0327845 | A1 | 12/2009 | Currivan et al. | |
| 2010/0050057 | A1 | 2/2010 | Luby | |
| 2010/0054376 | A1 | 3/2010 | Park et al. | |
| 2010/0085221 | A1* | 4/2010 | Monro | 341/65 |

* cited by examiner

*Primary Examiner* — Linh Nguyen
(74) *Attorney, Agent, or Firm* — The Farrell Law Firm, P.C.

(57) ABSTRACT

An encoding apparatus and method in a communication/broadcasting system are provided. When an encoding symbol is generated using at least one source symbol from among total source symbols to be encoded, encoding symbols are generated by using each of the total source symbols with a uniform probability before repeatedly using any of the total source symbols.

16 Claims, 6 Drawing Sheets

APPARATUS AND METHOD FOR CHANNEL ENCODING IN A COMMUNICATION/BROADCASTING SYSTEM

PRIORITY

This application claims priority under 35 U.S.C. §119(a) to a Korean Patent Application filed in the Korean Intellectual Property Office on Apr. 5, 2010 and assigned Serial No. 10-2010-0031147, the entire disclosure of which is incorporated herein by reference.

BACKGROUND OF THE INVENTION

1. Field of the Invention

The present invention relates generally to an apparatus and method for channel encoding in a communication/broadcasting system, and more particularly, to an apparatus and method for encoding an input symbol using a Fountain code.

2. Description of the Related Art

Ideally, a communication/broadcasting system is capable of transmitting information without errors on a communication/broadcasting channel. For example, if the communication/broadcasting channel has perfect fidelity, a receiver can receive the very same data that a transmitter has transmitted.

In real implementation, however, information is distorted during transmission on the communication/broadcasting channel due to noise, fading, and Inter-Symbol Interference (ISI), etc. Therefore, different technologies for overcoming information distortion have been developed.

Extensive research has recently been conducted on error-correction codes to increase the reliability of communication/broadcasting through efficient correction of information distortion.

To maximize an amount of transmission data, an error-correction code should be designed to have the best performance according to the reliability of a communication/broadcasting channel and the characteristics of transmission information. For example, an error-correction code that is robust against burst errors is often used for a communication/broadcasting channel whose reliability rapidly decreases for a particular time interval, although it has high fidelity for most of time.

An Internet-based protocol, such as Transmission Control Protocol (TCP), adopts Automatic Repeat reQuest (ARQ) to overcome the effects of packet loss.

In ARQ, if a receiver successfully receives a packet from a transmitter, it transmits an ACKnowledgment (ACK) signal to the transmitter. However, if the receiver fails to receive a packet, it transmits a Negative ACK (NACK) signal to the transmitter. When the transmitter receives a NACK signal or does not receive an ACK signal for a transmitted packet from the receiver, the transmitter retransmits the packet to the receiver.

The ARQ scheme ensures efficient information transmission for point-to-point communication between the transmitter and the receiver, in the presence of a feedback channel having high fidelity. However, if a single transmitter transmits information to a plurality of receivers or a plurality of transmitters transmit information to a plurality of receivers, the efficiency of the ARQ scheme rapidly decreases. Moreover, if the feedback channel has low fidelity or the feedback channel is not available, the ARQ scheme is not viable solution.

To solve some of the problems encountered with the ARQ scheme, a multi-to-multipoint transmission system may use erasure codes such as a Reed-Solomon (RS) code.

An RS code is very effective in achieving a channel capacity of an erasure channel. Despite this advantage, however, the RS code is effective only in applications with a limited number of source symbols in view of high encoding and decoding complexity.

An erasure code is characterized in that only if a sufficient number of packets are received, irrespective of packet reception or non-reception, data can be perfectly recovered by decoding the received packets. Most erasure codes have coding rates defined as a ratio between a number of source symbols and a number of encoding symbols. The coding rates are preset when designing the erasure codes.

In a communication/broadcasting system using an erasure code, a transmitter divides data into a plurality of input symbols and generates encoding symbols from the input symbols. Then, the transmitter constructs a packet with the encoding symbols and transmits the packet to a receiver.

Accordingly, the receiver does not transmit an ACK or NACK signal on a packet basis to the transmitter. A packet is an information unit including one or more symbols. However, erasure codes still may not effectively solve the problems of the ARQ scheme or may cause a new problem.

For example, with an erasure code, if the probability of receiving a packet without errors at the receiver is lower than a coding rate, information is not always recovered perfectly. That is, it is difficult for the receiver to perfectly recover information, when the number of received symbols is smaller than the number of source symbols. However, if the probability of receiving a packet without errors at the receiver is higher than the coding rate, information is often recovered perfectly. That is, it is possible for the receiver to perfectly recover information, when the number of received symbols is larger than the number of source symbols. Consequently, system overhead, i.e., the difference between the number of received symbols and the number of source symbols, increases in order to perfectly recover information.

Accordingly, a need exists for an encoding and decoding technique for enabling effective information recovery, without increasing overhead in a communication/broadcasting system.

SUMMARY OF THE INVENTION

The present invention is designed to address at least the problems and/or disadvantages above and to provide at least the advantages described below. Accordingly, an aspect of the present invention is to provide an encoding apparatus and method for generating encoding symbols by using source symbols at least once.

Another aspect of the present invention is to provide an encoding apparatus and method for generating encoding symbols by using source symbols at a uniform ratio, based on a Fountain code.

Another aspect of the present invention is to provide an encoding apparatus and method for optimizing a probability distribution of source symbol selection to generate encoding symbols in a communication/broadcasting system using a Luby-Transform (LT) code.

Another aspect of the present invention is to provide an encoding apparatus and method for selecting associated symbols for encoding, based on the number of times source symbols have been used in a communication/broadcasting system using an LT code.

Another aspect of the present invention is to provide an encoding apparatus and method for using all source symbols once for Fountain coding.

In accordance with an aspect of the present invention, there is provided an encoding method in a channel encoding apparatus. When an encoding symbol is generated using at least one source symbol from among total source symbols to be encoded, encoding symbols are generated by using each of the total source symbols with a uniform probability.

In accordance with another aspect of the present invention, an apparatus is provided for encoding a source symbol. The apparatus generates encoding symbols by using each of total source symbols to be encoded with a uniform probability, when an encoding symbol is generated using at least one source symbol from among the total source symbols.

In accordance with another aspect of the present invention, a method is provided for encoding a source symbol in an encoding apparatus. The method includes selecting at least one source symbol, taking into account an order of an encoding symbol to be generated and a value of a flag of each of total source symbols, generating the encoding symbol using the selected at least one source symbol, and changing the value of the flag of the selected at least one source symbol among the total source symbols.

In accordance with another aspect of the present invention, an apparatus is provided for encoding a source symbol. The apparatus includes an associated symbol selector that selects at least one source symbol, taking into account an order of an encoding symbol to be generated and a value of a flag of each of total source symbols, and changes the value of the flag of the selected at least one source symbol among the total source symbols; and an encoding symbol generator that generates the encoding symbol using the selected at least one source symbol.

BRIEF DESCRIPTION OF THE DRAWINGS

The above and other aspects, features and advantages of certain embodiments of the present invention will be more apparent from the following detailed description taken in conjunction with the accompanying drawings, in which.

DETAILED DESCRIPTION OF EMBODIMENTS OF THE INVENTION

Figure 1:
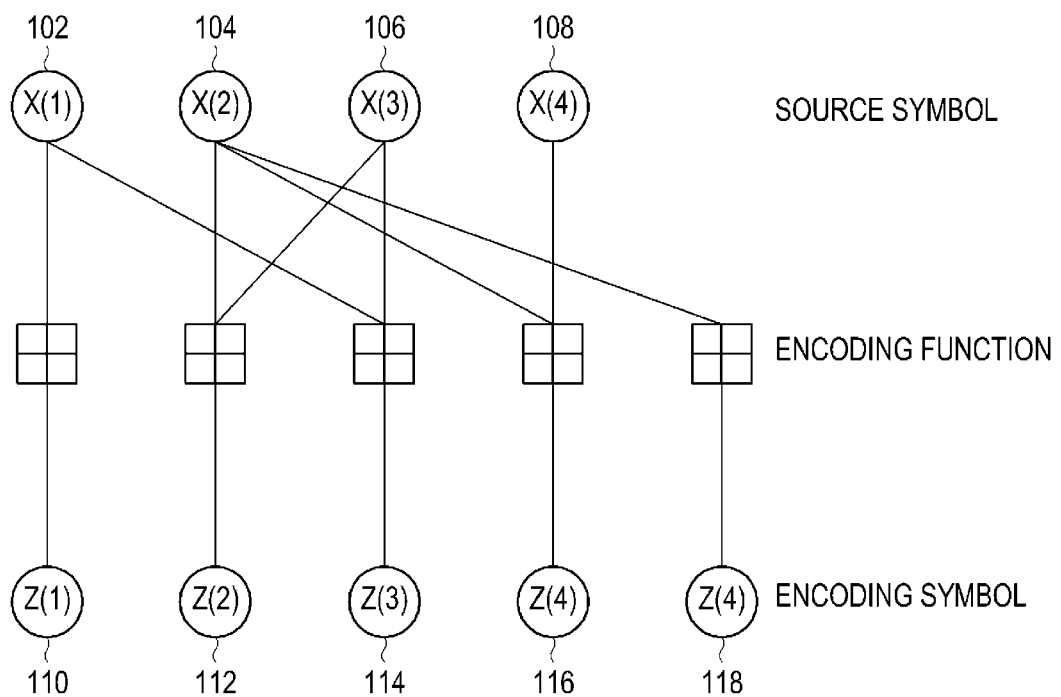
FIG. 1 is a factor graph illustrating conventional LT coding.

Various embodiments of the present invention will be described in detail below with reference to the accompanying drawings. Wherever possible, the same reference numbers will be used throughout the drawings and the specification to refer to the same or like parts.

Fountain codes, also known as rateless erasure codes, have a property that a potentially limitless sequence of encoding symbols can be generated from a given set of source symbols such that a receiver can recover original source symbols with a high probability from any subset of the encoding symbols of a size equal to or only slightly larger than the number of source symbols.

A Fountain code is optimal if an original k source symbols can be recovered from any k encoding symbols. Fountain codes are known that allow for the recovery of the original k source symbols from any k' encoding symbols with high probability using efficient encoding and decoding algorithms. k' is preferably equal to k but generally, k' is just slightly larger than k.

LT codes, as proposed by Michael Luby, were the first practical realization of Fountain codes. Raptor codes were the first Fountain codes to achieve linear time encoding and decoding complexity. Encoding and decoding of LT codes and Raptor codes can be expressed using factor graphs.

An LT encoding symbol can be calculated using an encoding function with one or more source symbols as parameters. Each encoding symbol is generated independently of the other encoding symbols. In theory, an infinite number of encoding symbols can be generated. Generally, the number of encoding symbols is limited to a particular value in a particular application.

A major encoding function used for generating encoding symbols is an eXclusive OR (XOR) function that calculates an encoding symbol by XOR-operating source symbols. Source symbols used to calculate an encoding symbol are referred to as "associated symbols" and the number of associated symbols is referred to as the "order of an encoding symbol".

In general, the order distribution of LT encoding symbols may be represented as by Equation (1).

$$\Omega(x) = d_1 x + d_2 x + \ldots + d_k x \qquad (1)$$

In Equation (1), k is a total number of source symbols used in an LT encoding procedure and $d_i$ is a probability that an order of a randomly selected encoding symbol is i.

The order distribution of encoding symbols described in Equation (1) is a critical factor that determines the performance of the LT code.

An LT encoding procedure using an XOR function as an encoding function can be summarized in the following step.

Step 1: An order $d_i$ is selected according to a given order distribution of encoding symbols.

Step 2: $d_i$ different source symbols are randomly selected with an equal probability.

Step 3: An encoding symbol $z_i$ is generated by XOR-operating the selected source symbols.

A transmitter transmits encoding symbols generated in the above LT encoding procedure on a channel. A receiver receives the encoding symbols and attempts to recover source symbols through LT decoding.

The LT decoding involves message passing on a factor graph representing an LT code or calculating a solution of a linear equation that describes a relationship between source symbols and encoding symbols. It is to be noted herein that the receiver should be able to receive orders of encoding symbols and indexes of source symbols used for encoding or it should be able to generate the same values in the same procedure as performed in the transmitter.

A Raptor code is a concatenation of an erasure code having a fixed coding rate and an LT code. A Raptor encoder may be configured by concatenating an erasure encoder having a fixed coding rate to an LT encoder.

Therefore, it is to be understood that a description of an LT encoder is applicable to all Fountain codes using LT codes.

FIG. 1 is a factor graph illustrating LT encoding.

Referring to FIG. 1, the factor graph is drawn using four source symbols X(1) 102, X(2) 104, X(3) 106 and X(4) 108 and five encoding symbols Z(1) 110, Z(2) 112, Z(3) 114, Z(4) 116, and Z(5) 118. An XOR operation $\oplus$ is used as an encoding function. A source symbol is an input symbol for encoding.

The relationship between source symbols and encoding symbols in the LT encoding procedure of FIG. 1 is defined in Equation (2).

$$Z(1)=X(1)$$
$$Z(2)=X(2)\oplus X(3)$$
$$Z(3)=X(1)\oplus X(3)$$
$$Z(4)=X(2)\oplus X(4)$$
$$Z(5)=X(2) \quad (2)$$

The order distribution of the LTE code illustrated in FIG. 1 is given in Equation (3).

$$\Omega(x) = \frac{2}{5}x + \frac{3}{5}x^2 \quad (3)$$

As described above, a Raptor code is a kind of Fountain code with linear time encoding and decoding. The Raptor code is a concatenation of an erasure code with a fixed coding rate and an LT code. The erasure code with a fixed coding rate in the Raptor code is referred to as a pre-code. The pre-code functions to recover a source symbol that is not recovered with the LT code.

The Raptor code may be systematic. In this case, source symbols to be transmitted are accurately included within encoding symbols. The systematic Raptor code is used as a forward error-correction code at the application layer for Multimedia Broadcasting and Multicasting Service (MBMS) in $3^{rd}$ Generation Partnership Project (3GPP).

During Raptor encoding, the pre-code generates r redundant symbols using K source symbols. The K source symbols and the r redundant symbols are collectively called "intermediate symbols".

Raptor encoding symbols may be generated by applying the LT encoding procedure, as described above, to the (K+r) intermediate symbols. The transmitter transmits the Raptor encoding symbols on a channel.

The receiver receives the Raptor encoding symbols on the channel and attempts to recover the source symbols from the received encoding symbols through Raptor decoding.

The Raptor decoding is separated into recovery of intermediate symbols through LT decoding and recovery of source symbols through decoding of the pre-code. Alternatively, Raptor decoding may be performed at one time by regarding the pre-code and the LT code as one code. The receiver should be able to receive orders of encoding symbols and indexes of source symbols used for encoding or it should be able to generate the same values in the same procedure as performed in the transmitter.

During the LT encoding procedure, each encoding symbol is generated by an XOR-operation of a few randomly selected source symbols. The order of each source symbol is information indicating a number of encoding symbols whose generation a source symbol is involved in.

If there is a sufficient number of encoding symbols, source symbols statistically have an equal order. However, a particular source symbol may not be involved in generation of any encoding symbol. That is, there is a probability that an order of a particular source symbol is 0, which significantly affects the success probability of LT decoding.

Because a Raptor code is a concatenation of an erasure code with a fixed coding rate and an LT code, the above-described issue also affects a success probability of Raptor decoding. Especially, if there are not a sufficient number of encoding symbols, the effect of the above-described issue becomes serious, such that it is necessary to develop an LT encoding method for solving the problem.

In accordance with an embodiment of the present invention, an apparatus and method are provided for generating encoding symbols by basically involving each of total source symbols in the generation of one or more encoding symbols. In accordance with another embodiment of the present invention, an apparatus is provided for reversely tracking source symbols used to generate encoding symbols and recovering the source symbols in a communication/broadcasting system using a Fountain code, and a method is provided for controlling the apparatus.

In accordance with an embodiment of the present invention, a flag indicating use or non-use of a source symbol is adopted for each symbol in order to generate a minimum number of encoding symbols using entire source symbols at least once, when one encoding symbol is generated from at least one source symbol among the entire source symbols to be encoded. That is, a flag for each source symbol is set to an initial value during initialization and if the source symbol is used in generation of an encoding symbol, the flag is changed to a different value. Changing the value of the flag allow a source symbol that has not yet been used for generating an encoding symbol to be used for generating a next encoding symbol, with priority.

Figure 2:
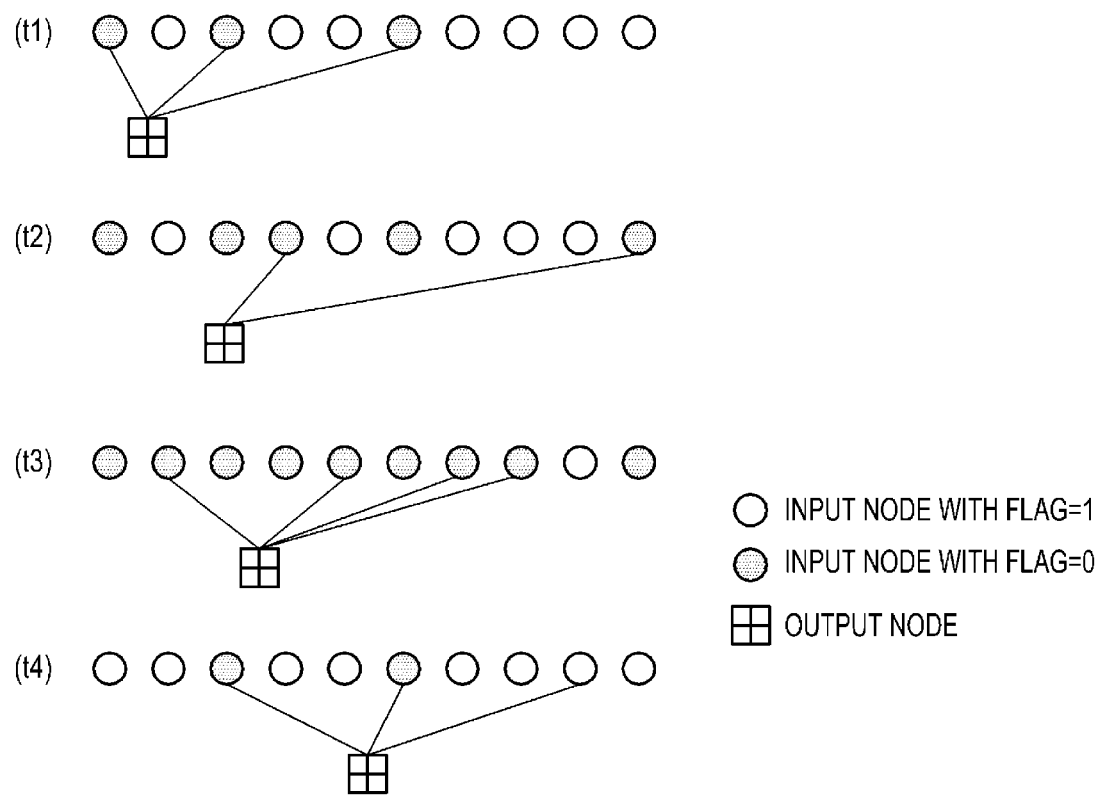
FIG. 2 conceptually illustrates an encoding method using a Fountain code according to an embodiment of the present invention.

FIG. 2 illustrates an encoding method using factor graphs according to an embodiment of the present invention.

To clarify the technical features of the encoding method according to an embodiment of the present invention, an individual factor graph is drawn for each encoding symbol generation in FIG. 2. It is assumed herein that a flag has already been set to a predetermined initial value for each source symbol.

Referring to FIG. 2, three (3) source symbols out of ten (10) total source symbols are selected for generating an initial encoding symbol at time (t1). The selected three source symbols are $1^{st}$, $3^{rd}$ and $6^{th}$ source symbols.

Because the flags of the 10 source symbols are assumed to be set to an initial value, the $1^{st}$, $3^{rd}$, and $6^{th}$ source symbols selected for generating the initial encoding symbol are then changed to a predetermined different value.

For generating a second encoding symbol at time (t2), two (2) source symbols are selected from among the seven (7) remaining source symbols, i.e., those not selected at (t1). The selected two source symbols are $4^{th}$ and $10^{th}$ source symbols. Thus, the flags of the $4^{th}$ and $10^{th}$ source symbols selected for generating the second encoding symbol are changed to the predetermined different value.

For generating a third encoding symbol at time (t3), four (4) source symbols are selected from among the five (5) remaining source symbols, those not selected at (t1) and t(2). The selected four source symbols are $2^{nd}$, $5^{th}$, $7^{th}$, and $8^{th}$ source symbols. Thus, the flags of the $2^{nd}$, $5^{th}$, $7^{th}$, and $8^{th}$ source symbols selected for generating the third encoding symbol are changed to the predetermined different value.

For generating a fourth encoding symbol at time (t4), three (3) source symbols are to be selected. However, there is only one remaining source symbol, because 9 source symbols out of the 10 source symbols were already used for generating the first, second, and third encoding symbols at times (t1), (t2), and (t3). Therefore, once the remaining one source symbol, i.e., the $9^{th}$ source symbol, is selected, all of the flags of the 10 source symbols are reset to the predetermined initial value.

Then, two more source symbols are selected from among the 10 source symbols, i.e., $3^{rd}$ and $6^{th}$ source symbols, and the flags of these source symbols are changed from the initial value to the predetermined different value.

As described above, the flags of selected source symbols are changed to the predetermined different value so that unused source symbols may be selected with priority in generating the next source symbol. For example, if the initial value of a flag is 1, the predetermined different value to which the flag is toggled is 0.

Accordingly, as many source symbols as needed are selected from among source symbols with flags set to 1, and an encoding symbol is generated using the selected source symbols. When the number of source symbols with flags set to 1 is smaller than the number of source symbols required for generating an encoding symbol, the source symbols with the flags set to 1 are first selected. Then, the flags of all of the source symbols are reset to the initial value, as many additional source symbols as needed are selected from among the source symbols, and the flags of the selected source symbols are changed to the predetermined different value.

Figure 3:
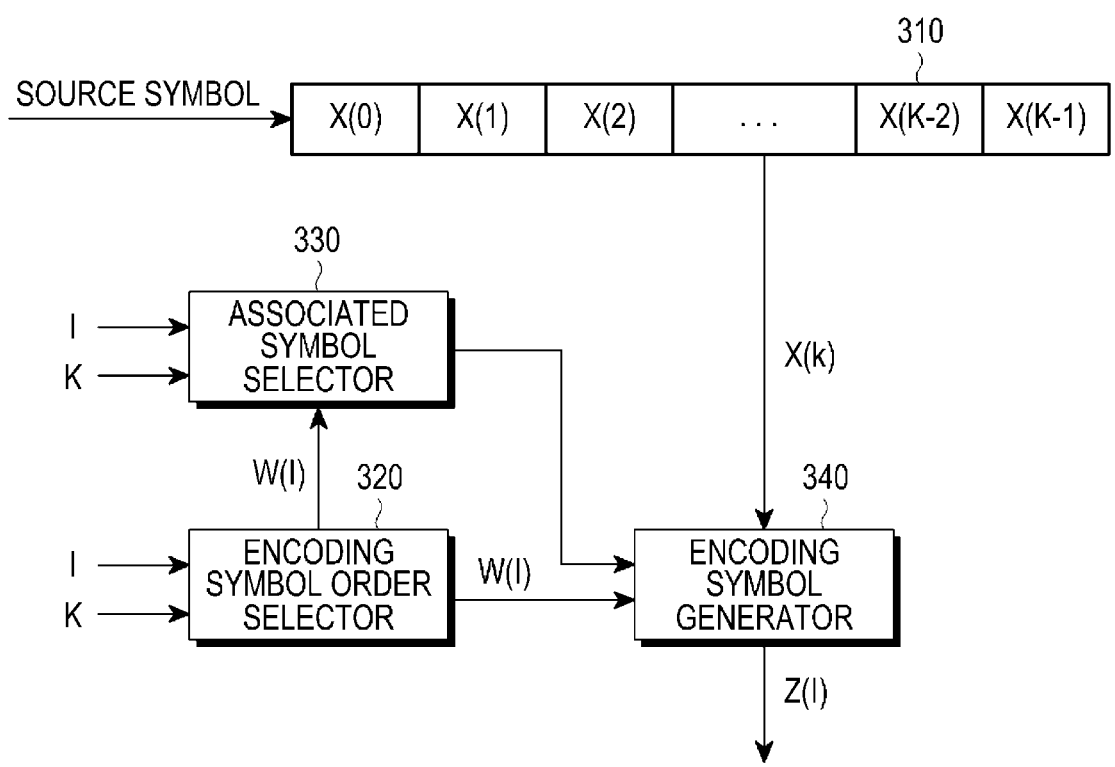
FIG. 3 is a block diagram of an LT encoder according to an embodiment of the present invention.

FIG. 3 is a block diagram of an encoder according to an embodiment of the present invention.

Referring to FIG. 3, K source symbols $X(0), X(1), \ldots, X(K-1)$ that wholly or partially form a file are buffered in a symbol buffer 310.

For the input of a key value I indicating an encoding symbol to be generated and the total number K of source symbols buffered in the symbol buffer 310, an encoding symbol order selector 320 selects the order of the encoding symbol W(I), using the key value I and the total number of source symbols K. The encoding symbol order W(I) refers to the number of source symbols used to generate the encoding symbol corresponding to the key value I, among the K source symbols.

The encoding symbol order selector 320 transmits the selected encoding symbol order W(I) to an associated symbol selector 330 and an encoding symbol generator 340.

The associated symbol selector 330 receives the key value I, the total number of source symbols K, and the encoding symbol order W(I), and selects at least one associated symbol corresponding to at least one source symbol based on the values I, K, and W(I) in order to generate the encoding symbol.

The associated symbol selector 330 may perform the procedure illustrated in FIG. 2 to select associated symbols. That is, each of the total source symbols may be involved in generating at least one encoding symbol.

Accordingly, when one encoding symbol is generated out of at least one source symbol among the total source symbols to be encoded, a flag is used for each source symbol to indicate whether the source symbol has been used for generating an encoding symbol, so that a minimum number of encoding symbols can be generated by using the total source symbols at least once. Specifically, the flags of the total source symbols are set to an initial value and the flag of at least one source symbol used in generating each encoding symbol is changed to a different value.

When all of the flags of the total source symbols are changed to the different value, all of the flags are then reset to the initial value.

The associated symbol selector 330 generates an associated symbol list AL(I) with the selected at least one associated symbol. The associated symbol list AL(I) lists as many source symbols as the encoding symbol order W(I) among the K total source symbols to generate the encoding symbol corresponding to the key value I.

The associated symbol selector 330 provides the associated symbol list AL(I) to the encoding symbol generator 340.

The encoding symbol generator 340 generates an encoding symbol Z(I) by applying an encoding function to as many source symbols as the encoding symbol order W(I) received from the encoding symbol order selector 320, based on the associated symbol list AL(I) received from the associated symbol selector 330, among the K source symbols buffered in the symbol buffer 310.

If the encoding symbol generator 340 can acquire information about the number of associated symbols from the associated symbol list AL(I) received from the associated symbol selector 330, it not necessary to receive the encoding symbol order W(I) from the encoding symbol order selector 320 in generating the encoding symbol Z(I).

Alternatively, an encoder may further include a configuration for selectively using an encoding function F(I) according to the key value I and the total number of source symbols K in generating an encoding symbol. However, as the above-described embodiment of the present invention is based on an assumption that the encoding function is an XOR function, the configuration for selectively applying the encoding function F(I) is not provided in the encoder.

In accordance with an embodiment of the present invention, the number of uses of each source symbol is limited so that each of total source symbols may be involved in generating at least one encoding symbol. That is, when encoding symbols are generated out of total source symbols, source symbols are selected an equal number of times. Preferably, the numbers of uses of the total source symbols are equal or the difference between the numbers of uses of source symbols does not exceed a maximum number of 1. It accordance with another embodiment of the present invention, the numbers of uses of the total source symbols are ensured simply to be 1 or larger. Hereinafter, the number of uses of a source symbol will be referred to as a "source symbol order", for ease of description.

Figure 4:
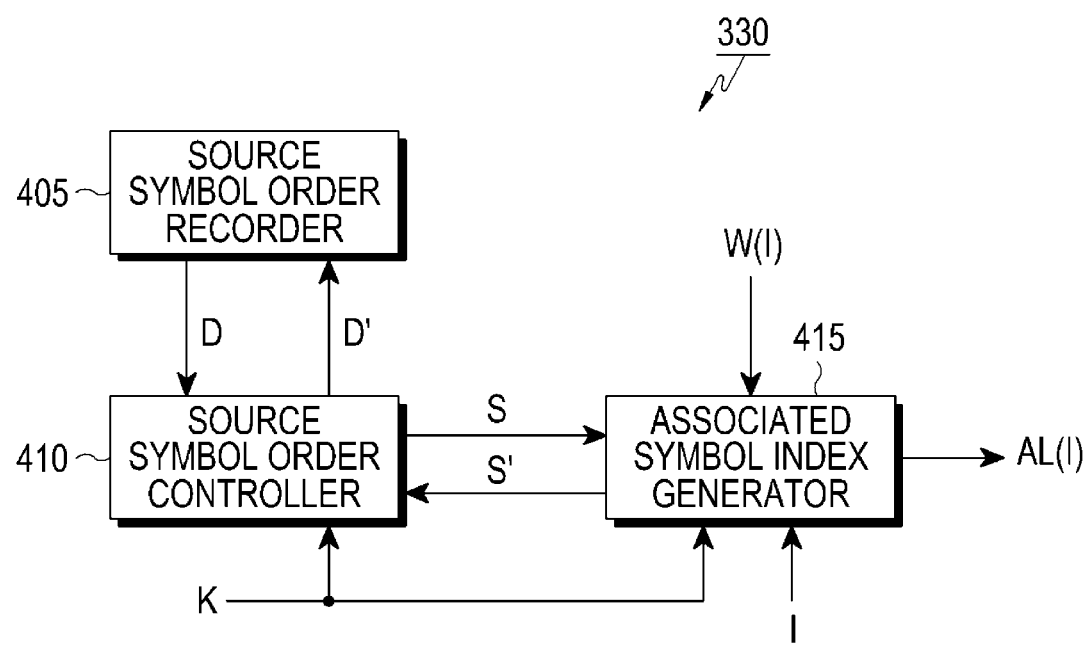
FIG. 4 is a block diagram of an associated symbol selector for controlling an order of a source symbol in an LT encoder according to an embodiment of the present invention.

FIG. 4 is a block diagram of an associated symbol selector 330 for controlling an order of a source symbol in the encoder according to an embodiment of the present invention.

Referring to FIG. 4, the associated symbol selector 330 includes a source symbol order recorder 405, a source symbol order controller 410, and an associated symbol index generator 415. The source symbol order recorder 405 stores information D about the order of each source symbol and provides the stored source symbol order information D to the source symbol order controller 410. For example, the source symbol order recorder 405 may transmit information about the orders of a part of the total source symbols to the source symbol order controller 410. In this case, the source symbol order recorder 405 may receive source symbol selection information indicating source symbols whose orders are needed from the source symbol order controller 410.

The source symbol order recorder 405 updates the source symbol order information D based on changed source symbol order information D' received from the source symbol order controller 410. Herein, the source symbol order recorder 405 may receive information about the orders of some source symbols to be updated from the source symbol order controller 410.

For the input of the source symbol order information D from the source symbol order recorder 405 and the total number of source symbols K, the source symbol order controller 410 generates source symbol order distribution information S and provides the source symbol order distribution information S to the associated symbol index generator 415.

The source symbol order controller 410 receives changed source symbol order distribution information S' from the associated symbol index generator 415 and updates the source symbol order information D with the changed source symbol order distribution information S'. Thereafter, the source symbol order controller 410 provides the updated source symbol order information D' to the source symbol order recorder 405.

For the input of the total number of source symbols K, the key value I identifying an encoding symbol to be generated, the order W(I) of the encoding symbol, and the source symbol order distribution information S, the associated symbol index generator 415 generates associated symbol indexes AL(I) and transmits the associated symbol indexes AL(I) to the encoding symbol generator 340, as illustrated in FIG. 3.

When needed, the associated symbol index generator 415 updates the source symbol order distribution information S and outputs the updated source symbol order distribution information S' to the source symbol order controller 410.

Although the associated symbol selector 330 for controlling the order of a source symbol is illustrated with specific components in FIG. 4, this should not be construed as limiting the present invention. That is, depending on the implementation of the associated symbol selector 330, the input and output signals of each component may take various forms and some components may be omitted from the configuration of the associated symbol selector 330 illustrated in FIG. 4. Additionally, some components may be incorporated into a single component or an additional control signal may be included in the associated symbol selector 330 illustrated in FIG. 4.

Figure 5:
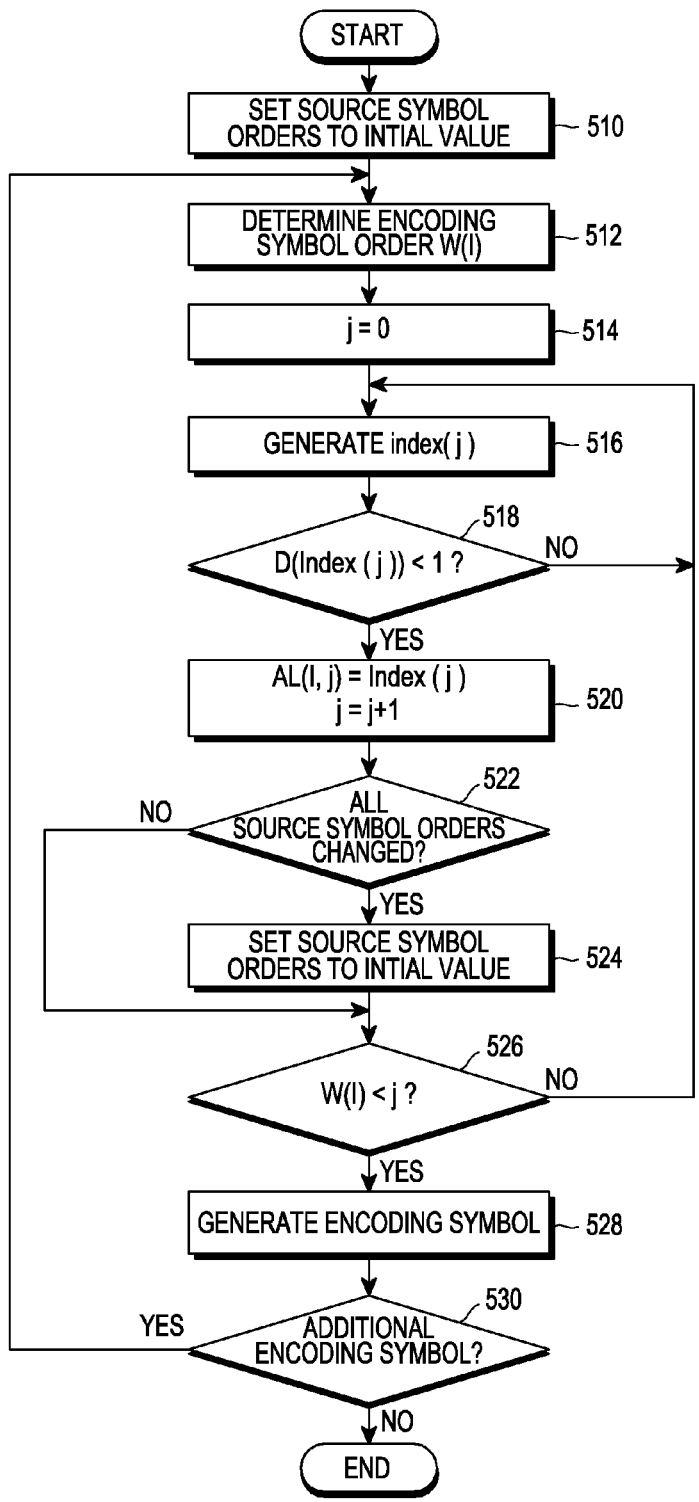
FIG. 5 is a flowchart illustrating an LT encoding procedure at an encoder of a transmitter according to an embodiment of the present invention.

FIG. 5 is a flowchart illustrating an encoding procedure in an encoder of a transmitter according to an embodiment of the present invention.

Referring to FIG. 5, the encoder of the transmitter sets a source symbol order to an initial value in step 510. Specifically, the encoder sets the order of each of the total source symbols for encoding to an initial value. If the initial value is 0, the orders (or flags) of K source symbols are set to 0, which may be generalized to Equation (4).

$$D(i)=0 \text{ for } i=0,\ldots,K-1 \quad (4)$$

The encoder determines the order W(I) of an encoding symbol to be generated in step 512. The encoding symbol order W(I) is the number of associated symbols. The associated symbols refer to one or more source symbols to be used for generating the encoding symbol.

Once the encoding symbol order W(I) is determined, the encoder sets a count j to an initial value 0 in order to count the encoding symbol order W(I) in step 514. That is, the count j is set to the initial value to monitor indexing of at least one associated symbol to be used for generating the encoding symbol.

In step 516, the encoder generates the index of a $j^{th}$ associated symbol index(j). index(j) should satisfy the condition that $0 \leq \text{index}(j) \leq K-1$.

Upon completion of indexing the $j^{th}$ associated symbol, the encoder determines whether the order of the $j^{th}$ associated symbol is smaller than 1 in step 518. That is, it is determined whether the $j^{th}$ associated symbol has already been used to generate an encoding symbol. If the source symbol order is set to an initial value other than 0 in step 510, the order of the $j^{th}$ associated symbol may be compared with a value other than 0 in step 518.

If determining that the $j^{th}$ associated symbol has already been used for generating an encoding symbol in step 518, the encoder returns to step 516, generates a new index for the $j^{th}$ associated symbol, and performs step 518 again.

When the $j^{th}$ associated symbol is used for generation of an encoding symbol for the first time in step 518, i.e., when the index(j) is less than 1, the encoder registers the generated index index(j) to an associated symbol index list AL(I,j), and increments the count j by 1 for the next indexing operation and changes the order of the associated symbol which has been indexed from 0 to 1, in step 520. As described above, the order of the associated symbol is changed from 0 to 1 is to prevent a source symbol already used for encoding from being used in generation of another encoding symbol, before all other symbols are used at least once.

In step 522, the encoder determines whether all of the orders of the total source symbols have been changed from the initial value 0 to 1. That is, it is determined whether each of the total source symbols has been used once for generation of an encoding symbol.

If the encoder determines that the total source symbols have been used for generating encoding symbols, it resets the orders of the total source symbols to the initial value in step 524.

If the encoder determines that the total source symbols have not all been used for generating encoding symbols or after the total source symbols are reset to the initial value, the encoder compares the current count j with the encoding symbol order W(I) in step 526. That is, the encoder determines whether associated symbols corresponding to as many source symbols as the encoding symbol order W(I) have been completely indexed.

If the associated symbols corresponding to as many source symbols as the encoding symbol order W(I) have not been completely indexed, the encoder repeats steps 516 to 526.

However, if the associated symbols corresponding to as many source symbols as the encoding symbol order W(I) have been completely indexed, the encoder generates an encoding symbol using at least one source symbol selected from among the total source symbols according to the indexes of the associated symbols AL(I) and the encoding symbol order W(I) in step 528. For generating the encoding symbol, a predetermined encoding function such as an XOR operation is used.

In step 530, the encoder determines if there is an encoding symbol to be generated. If the encoder determines to generate an additional encoding symbol, the encoder repeats steps 512 to 528. However, if there is no need for generating an additional encoding symbol, the encoder ends the encoding operation for generating encoding symbols from source symbols.

Figure 6:
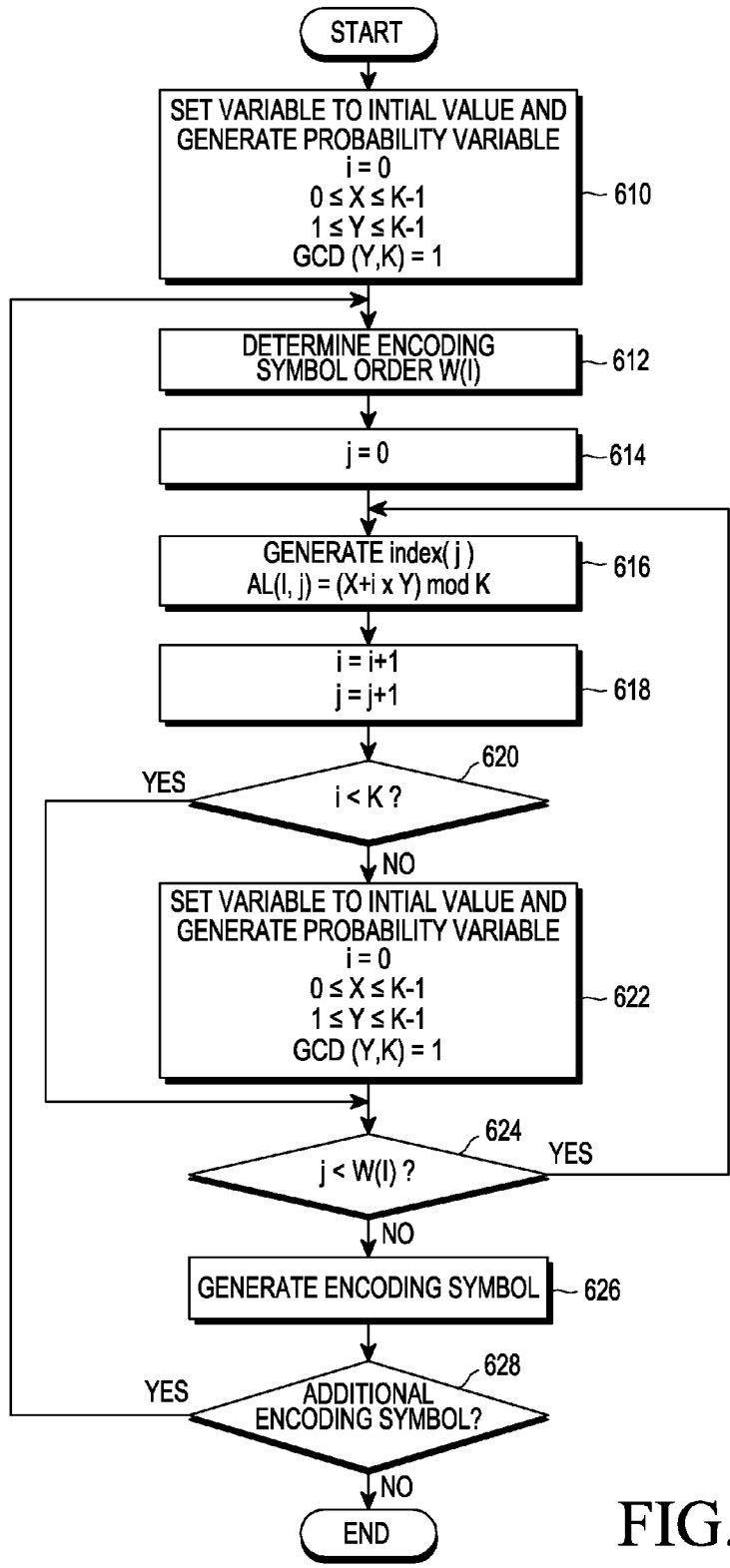
FIG. 6 is a flowchart illustrating an LT encoding procedure at an encoder of a transmitter according to another embodiment of the present invention.

FIG. 6 is a flowchart illustrating an encoding procedure in an encoder of a transmitter according to another embodiment of the present invention.

Referring to FIG. 6, the encoder of the transmitter sets a variable to an initial value and generates a probability variable in step 610. The variable is an index i for selecting a source symbol for encoding. The probability variable is a factor for selecting an associated symbol to be indexed.

For example, the variable i may be set to an initial value 0 and the probability variable may be generated using Equation (5).

$$0 \leq X \leq K-1$$

$$1 \leq Y \leq K-1$$

$$GCD(Y,K)=1 \quad (5)$$

The encoder determines the order W(I) of an encoding symbol to be generated in step 612. The encoding symbol order W(I) is the number of associated symbols. The associated symbols refer to one or more source symbols to be used for generating the encoding symbol.

Once the encoding symbol order W(I) is determined, the encoder sets a count j to an initial value 0 in order to count the encoding symbol order W(I) in step 614. That is, the count j is set to the initial value to monitor indexing of at least one associated symbol required for generation of the encoding symbol.

In step 616, the encoder generates the index of a $j^{th}$ associated symbol AL(I, j). The index of the $j^{th}$ associated symbol AL(I, j) may be calculated by (X+i*Y) mod K.

Upon completion of indexing the $j^{th}$ associated symbol, the encoder increments the variable i by 1 to select the next source symbol, and increments the count j by 1 to count the number of associated symbols required to generate the encoding symbol in step 618.

In step 620, the encoder determines whether each of the total source symbols have been used for generating an encoding symbol. That is, the encoder checks whether the variable i is smaller than the total number of source symbols K. If the variable i is smaller than the total number of source symbols K, the encoder determines that all of the source symbols have not been used for generating encoding symbols. If the variable i is greater than or equal to the total number of source symbols K, the encoder determines that the total source symbols have been used for generating encoding symbols.

When the total source symbols have been used for generating encoding symbols, the encoder sets the variable i to the initial value and generates a probability variable in step 622. Step 622 may be performed in the same manner as step 610.

However, if there are any remaining source symbols that have not been used for generating an encoding symbol after step 622, the encoder determines whether associated symbols corresponding to as many source symbols as the encoding symbol order W(I) have been completely indexed by comparing the count j with the encoding symbol order W(I) in step 624.

If the count j is smaller than the encoding symbol order W(I), it is determined that the associated symbols corresponding to as many source symbols as the encoding symbol order W(I) have not been completely indexed. In this case, the encoder repeats the indexing operation in steps 616 to 622.

However, if the count j is greater than or equal to the encoding symbol order W(I), it is determined that the associated symbols corresponding to as many source symbols as the encoding symbol order W(I) have been completely indexed. In this case, the encoder generates an encoding symbol using at least one source symbol selected from among the total source symbols according to the indexes of the associated symbols AL(I) and the encoding symbol order W(I) in step 626. For generating the encoding symbol, a predetermined encoding function such as an XOR operation is used.

If an encoding symbol is generated from one source symbol, each source symbol may be regarded as an encoding symbol without encoding using a predetermined encoding function.

In step 628, the encoder determines whether there are any additional encoding symbols to be generated. If the encoder determines to generate an additional encoding symbol, the encoder repeats steps 612 to 626. However, if there are no additional encoding symbols to be generated, the encoder ends the encoding operation.

The term "communication/broadcasting channel", as used herein, refers to a wired channel or a radio channel between a transmitter and a receiver that are spatially apart from each other, a time channel that carries information extracted at a given time from a storage medium that stores information, and a combination of the spatial channel and the time channel.

Information delivered on the communication/broadcasting channel includes multimedia information such as a video or audio file, signaling information for a particular application, and a data file, as well as conventional text and voice information.

As is apparent from the embodiments of the present invention described above, because associated symbols are selected based on orders of source symbols to generate encoding symbols, each of total source symbols are used to generate at least one encoding symbol. Consequently, the total source symbols are used for encoding, with a uniform probability, thereby improving encoding performance.

While the present invention has been particularly shown and described with reference to certain embodiments thereof, it will be understood by those of ordinary skill in the art that various changes in form and details may be made therein without departing from the spirit and scope of the present invention as defined by the following claims and their equivalents.

What is claimed is:

1. An encoding method in a channel encoding apparatus, comprising:
   generating encoding symbols by using each of total source symbols to be encoded with a uniform probability before repeatedly using any of the total source symbols; and
   changing a flag of a source symbol among the total source symbols that is used for an encoding symbol,
   wherein each of the encoding symbols is generated using at least one source symbol from among the total source symbols.

2. The method of claim 1, wherein flags of each of the total source symbols are set to an initial value during initialization and when values of flags of each of the total source symbols are changed.

3. The method of claim 1, wherein a source symbol with an unchanged flag value is first used for generation of an encoding symbol, and if a number of source symbols with unchanged flag values is smaller than a number of source symbols to be used for generating the encoding symbol, as many source symbols with changed flag values as the number of additionally required source symbols are used for generation of the encoding symbol.

4. An apparatus for encoding a source symbol, comprising:
   an encoder that generates encoding symbols by using each of total source symbols to be encoded with a uniform probability before repeatedly using any of the total source symbols,
   wherein each of the encoding symbols is generated using at least one source symbol from among the total source symbols, and
   wherein a flag of a source symbol among the total source symbols is changed to a different value after the source symbol is used for an encoding symbol.

5. The apparatus of claim 4, wherein flags of each of the total source symbols are set to an initial value during initialization and when values of the flags of each of the total source symbols are changed.

6. The apparatus of claim 4, wherein a source symbol with an unchanged flag value is first used for generation of an encoding symbol, and if a number of source symbols with unchanged flag values is smaller than a number of source symbols to be used for generating the encoding symbol, as many source symbols with changed flag values as the number of additionally required source symbols are used for generation of the encoding symbol.

7. A method for encoding a source symbol in an encoding apparatus, comprising:
  selecting at least one source symbol, taking into account an order of an encoding symbol to be generated and a value of a flag of each of total source symbols;
  generating the encoding symbol using the selected at least one source symbol; and
  changing the value of the flag of the selected at least one source symbol among the total source symbols.

8. The method of claim 7, further comprising setting the flag of each of the total source symbols to an initial value before an initial encoding symbol is generated and when all values of the flags of the total source symbols are changed.

9. The method of claim 7, wherein selecting at least one source symbol comprises:
  receiving a key value indicating the encoding symbol to be generated, a total number of the total source symbols, and an order of the encoding symbol to be generated; and
  generating an associated symbol list for the key value indicating the encoding symbol to be generated, using as many source symbols as the order of the encoding symbol from among the total source symbols.

10. The method of claim 9, wherein as many source symbols as the order of the encoding symbol are selected from among source symbols with unchanged flag values among the total source symbols or the total source symbols with flags set to an initial value.

11. The method of claim 7, wherein a numbers of times flags of the total source symbols are changed are equal or a difference between the numbers of times the flags of source symbols are changed does not exceed 1.

12. An apparatus for encoding a source symbol, comprising:
  an associated symbol selector for selecting at least one source symbol, taking into account an order of an encoding symbol to be generated and a value of a flag of each of total source symbols, and changing a value of a flag of a selected at least one source symbol among the total source symbols; and
  an encoding symbol generator for generating the encoding symbol using the selected at least one source symbol.

13. The apparatus of claim 12, wherein the associated symbol selector sets the flag of each of the total source symbols to an initial value before an initial encoding symbol is generated and when all values of the flags of the total source symbols are changed.

14. The apparatus of claim 12, wherein the associated symbol selector receives a key value indicating the encoding symbol to be generated, a total number of the total source symbols, and the order of the encoding symbol to be generated, and generates an associated symbol list for the key value indicating the encoding symbol to be generated, using as many source symbols as the order of the encoding symbol from among the total source symbols.

15. The apparatus of claim 14, wherein the associated symbol selector selects as many source symbols as the order of the encoding symbol from among source symbols with unchanged flag values among the total source symbols or the total source symbols with flags set to an initial value.

16. The apparatus of claim 12, wherein a numbers of times flags of the total source symbols are changed are equal or a difference between the numbers of times the flags of source symbols are changed does not exceed 1.

\* \* \* \* \*